United States Patent
Karthaus et al.

(10) Patent No.: US 8,400,223 B2
(45) Date of Patent: Mar. 19, 2013

(54) AMPLIFIER ARRANGEMENT

(75) Inventors: Udo Karthaus, Neu-Ulm (DE); Lothar Schmidt, Erbach (DE)

(73) Assignee: Ubidyne, Inc., Wilmington, DE (US)

( * ) Notice: Subject to any disclaimer, the term of this patent is extended or adjusted under 35 U.S.C. 154(b) by 0 days.

(21) Appl. No.: 13/022,113

(22) Filed: Feb. 7, 2011

(65) Prior Publication Data
US 2012/0200359 A1   Aug. 9, 2012

(51) Int. Cl.
*H03F 1/34*   (2006.01)
(52) U.S. Cl. ........... 330/291; 330/84; 330/295; 330/285
(58) Field of Classification Search .......... 330/295–296, 330/124 R, 285, 84–85
See application file for complete search history.

(56) References Cited

U.S. PATENT DOCUMENTS

| 5,321,279 A | 6/1994 | Khatibzadeh et al. |
| 6,750,721 B2 * | 6/2004 | Patterson ...................... 330/295 |
| 2004/0201421 A1 | 10/2004 | Winslow |

FOREIGN PATENT DOCUMENTS
EP   597397   5/1994

* cited by examiner

*Primary Examiner* — Hieu Nguyen
(74) *Attorney, Agent, or Firm* — Stephen H. Eland; Dann, Dorfman, Herrell & Skillman

(57) ABSTRACT

An amplifier arrangement with an amplifier arrangement input and an amplifier arrangement output is disclosed. The amplifier arrangement comprises a first transistor and a first ballast resistance, wherein the first ballast resistance connects a first transistor base of the first transistor to a common base terminal at least one second transistor and at least one second ballast resistance, wherein the at least one second ballast resistance connects a second transistor base of the at least second transistor to the common base terminal; and a feedback device comprising a feedback input terminal for sensing at least a base voltage of the first transistor and further comprising a feedback output terminal that is connected to the common base terminal.

7 Claims, 5 Drawing Sheets

AMPLIFIER ARRANGEMENT

CROSS-REFERENCE TO RELATED APPLICATIONS

None

FIELD OF THE INVENTION

The field of the present application relates in general to an amplifier arrangement and in particular to a radio station with an amplifier arrangement. The field of the application also relates to an integrated circuit comprising an amplifier arrangement as well as a method of manufacturing an amplifier arrangement. The field of the application further relates to a computer program product comprising an integrated circuit for an amplifier arrangement.

BACKGROUND OF THE INVENTION

Power amplifiers are known to produce a considerable amount of heat which causes a semiconductor device to heat up in the event the heat cannot be dissipated quickly enough. As semiconductor materials, such as silicon and germanium, have a negative temperature coefficient above a certain temperature, electric currents in the semiconductor device can progressively rise and irreversibly destroy the semiconductor device, a situation which is known as "thermal runaway". It is therefore known to use in integrated circuits parallely arranged amplifier cells to enable distributing the currents and also to enable the dissipation of heat over a number of the amplifier cells. In an ideal world the currents and heat losses would be distributed equally. In practice, it is found that at least one of the parallely arranged amplifier cells may draw more current than others ones of the parallely arranged amplifier cells, due to small asymmetries in the parallely arranged amplifier cells. The asymmetries are self-energizing due to the negative temperature coefficient of semiconductors so that in the end one of the parallely arranged amplifier cells heats up more than the others, further increasing its collector current. Thus the largest fraction of a current might end up passing through only one of the several parallel amplifier cells, a situation commonly known as "current hogging".

From EP 0 597 397 A2 a high power bipolar amplifier employed as a multi-finger structure with a plurality of transistor cells is known with integrated ballast resistances, such as resistors connected to each of a base finger. This kind of solution is especially effective in connection with HBTs, as the base fingers are generally electrically isolated allowing the possibility of an integrated base ballast resistor. As EP 0 597 397 points out, silicon bipolar transistors usually use integrated ballast resistances in the emitter finger as the base fingers are not electrically isolated.

In the event that one specific transistor cell is conducting more current than the other transistor cells this specific transistor cell will draw more base current than the other transistor cells. The increased base current will increase the voltage drop across the ballast resistance, thus causing a reduction of the base voltage. As a consequence the reduction of the base voltage reduces the current flowing through the collector of that specific transistor cell. Thus the ballast resistances counteract the current hogging, but too much of the ballasting leads to early compression.

The use of mobile communications networks has increased over the last decade. Operators of the mobile communications networks have increased the number of base transceiver stations in order to meet an increased demand for service by users of the mobile communications network. The operators of the mobile communications network wish to purchase components for the base transceiver stations at a lower price and also wish to reduce the running costs of the base transceiver station. Since power amplifiers consume more than 50% of the total power of a transmitter system, improvements in the efficiency and linearity of the power amplifier technology, such as preventing early compression in amplifier design are contributors to more efficient base transceiver stations and/or active antenna arrays.

SUMMARY OF THE INVENTION

It is an aspect of the teachings of the present disclosure to provide an amplifier arrangement for amplifying a radio signal comprising a first transistor and a first ballast resistance, wherein the first ballast resistance connects a first transistor base of the first transistor to a common base terminal. The amplifier arrangement further comprises at least one second transistor and at least one second ballast resistance, wherein the at least one second ballast resistance connects a second transistor base of the at least second transistor to the common base terminal. The amplifier arrangement further comprises a feedback device with a feedback input terminal for sensing at least a base voltage of the first transistor. The feedback device further comprises a feedback output terminal that is connected to the common base terminal.

The feedback device is designed to keep hold the base voltages of all of the transistors at a constant value. Due to the constant base voltages the value of the ballast resistances can be chosen higher without the risk of running into saturation, which would cause early signal compression. The higher value of the ballast resistances enables a more equal distribution of the collector currents streaming through each one of the transistors.

The term "transistors" in this context can refer either to a single base finger transistor or to one or more fingers of a multi base finger transistor.

In another aspect of the present disclosure a first feedback resistance connects the first transistor base of the first transistor to the feedback device input terminal. Depending on the geometrical layout of the transistors, some transistors are more susceptible to thermal runaway than other ones of the transistors. Therefore it might suffice to apply the feedback only a subset of the transistors. In the most extreme example it may even suffice to provide the feedback for only a single one of the transistors.

In another aspect of the teachings of the present disclosure the at least one second feedback resistance connects the second base of the at least one second transistor to the feedback device input terminal.

Another aspect of the present disclosure is that the first transistor and the least one second transistor are heterojunction bipolar transistors or homojunction bipolar transistors.

Another aspect of the present disclosure is that the feedback device comprises a feedback transistor with a feedback transistor base, a feedback transistor emitter and a feedback transistor collector, and wherein the feedback transistor base is the input of the feedback device. In the most simplified approach the feedback device may comprise only a single active element, such as a transistor.

Another aspect of present disclosure is that the amplifier arrangement further comprises a bias supply transistor, the bias supply transistor comprising a bias supply transistor base, a bias supply transistor collector and a bias supply transistor emitter, wherein the bias supply transistor emitter is the output of the feedback device.

In another aspect of the present disclosure the feedback transistor emitter is connected to a reference voltage. The feedback transistor collector is connected through a bias setting resistor to a supply voltage. The bias supply transistor base is connected to the feedback transistor collector. The bias supply transistor collector is connected to the supply voltage and the bias supply transistor emitter is connected through an emitter resistance to the reference voltage.

In this aspect of the present disclosure the combination of the feedback transistor, the bias supply transistor as well as the first transistor and the second (or more) transistors form jointly a current mirror.

Another aspect of present disclosure is that the feedback transistor collector and the feedback transistor base are connected to each other through a first capacitor. The first capacitor serves as a low pass filter. This low pass filter improves the stability of the feedback device since the section of the feedback device formed by the feedback transistor operates more slowly than the other sections of the feedback device, thus introducing a dominant pole to the bias control feedback device.

In another aspect of the amplifier arrangement the feedback device is a direct current operational voltage amplifier comprising a non-inverting input, an inverting input and a operational voltage amplifier output. The non-inverting input is connected to a reference level. The inverting input is the feedback device input and the operational voltage amplifier output is the feedback device output.

Another aspect of the present disclosure is an integrated circuit comprising an amplifier arrangement for amplifying a radio signal comprises a first transistor, a first ballast resistance, at least one second transistor, and at least one second ballast resistance. The first ballast resistance connects a first transistor base of the first transistor to a common base terminal. The at least one second ballast resistance connects a second transistor base of the at least second transistor to the common base terminal. The amplifier arrangement further comprises a feedback device, the feedback device comprising a feedback input terminal for sensing at least a base voltage of the first transistor. The feedback device further comprises a feedback output terminal that is connected to the common base terminal.

Another aspect of the present disclosure is a method of manufacturing an amplifier arrangement comprising connecting a first ballast resistance to a first transistor base of a first transistor, connecting the first ballast resistance to a common base terminal, connecting at least one second ballast resistance to a second transistor base of at least one second transistor, connecting the at least one second ballast resistance to the common base terminal; and connecting a feedback device to the common base terminal.

Another aspect of the teaching of this disclosure is a computer program product comprising a non-transitory computer-usable medium having control logic stored therein for causing a computer to manufacture a amplifier arrangement for amplifying a radio signal comprising connecting a first ballast resistance to a first transistor base of a first transistor, connecting the first ballast resistance to a common base terminal, connecting at least one second ballast resistance to a second transistor base of at least one second transistor, connecting the at least one second ballast resistance to the common base terminal; and connecting a feedback device to the common base terminal.

A further aspect of the invention is a computer program product comprising a non-transitory computer-usable medium having control logic stored therein for causing a computer to manufacture an amplifier arrangement with an amplifier arrangement input and an amplifier arrangement output, the amplifier arrangement comprising a first transistor and a first ballast resistance, wherein the first ballast resistance connects a first transistor base of the first transistor to a common base terminal, at least one second transistor and at least one second ballast resistance, wherein the at least one second ballast resistance connects a second transistor base of the at least second transistor to the common base terminal; and a feedback device comprising a feedback input terminal for sensing at least a base voltage of the first transistor and further comprising a feedback output terminal that is connected to the common base terminal.

DESCRIPTION OF THE FIGURES

FIG. 1c shows a variation of the amplifier arrangement of FIG. 1a.

FIG. 2 shows a simulation result of an aspect of the amplifier arrangement according to FIG. 1a.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1A:
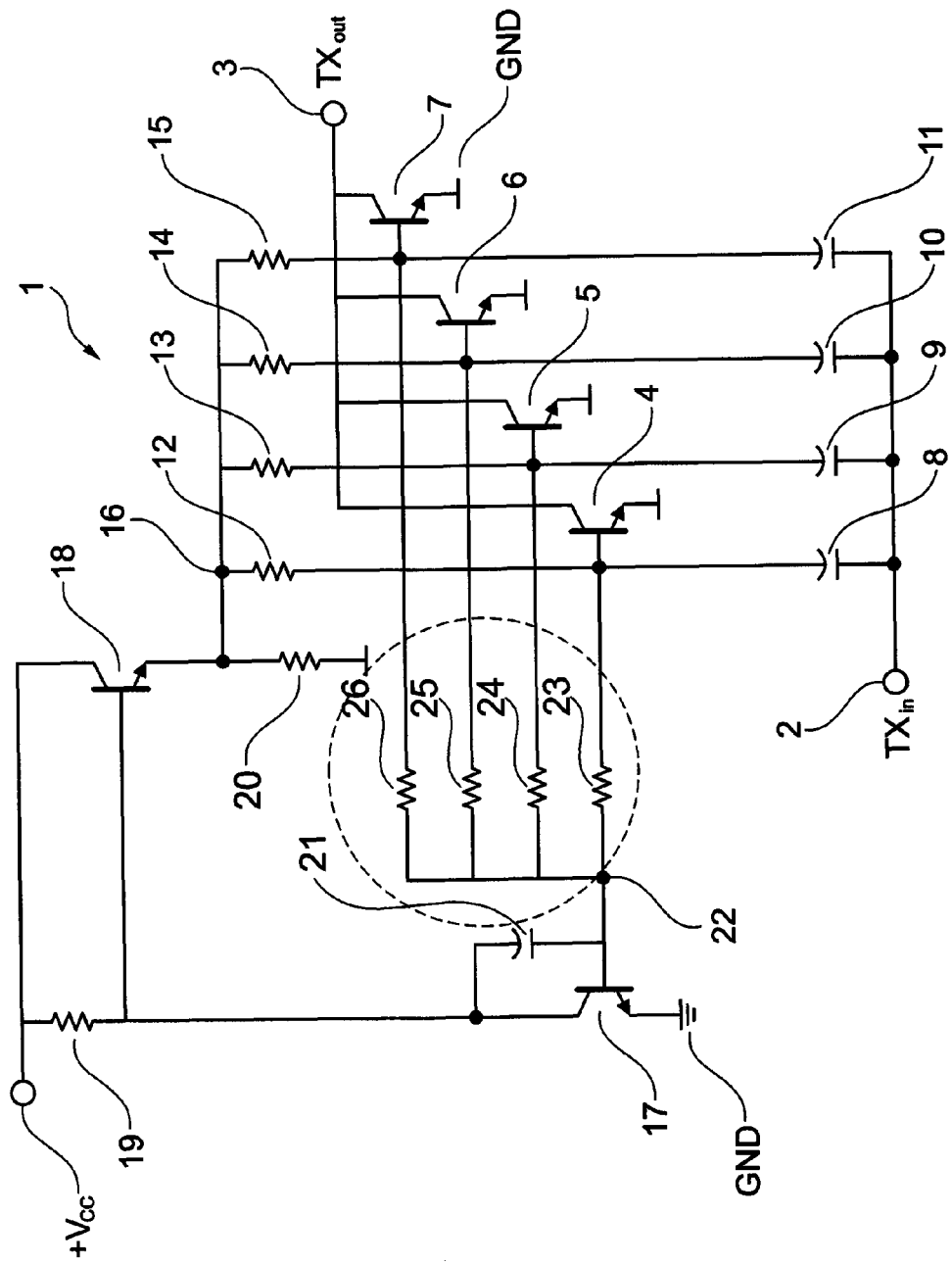
FIG. 1a shows a first aspect of the amplifier arrangement according to the present disclosure.

FIG. 1a shows a first aspect of an amplifier arrangement 1 according to the present disclosure for amplifying an amplifier arrangement input signal $TX_{in}$ received at an amplifier arrangement input 2 and providing an amplifier arrangement output signal $TX_{out}$ at an amplifier arrangement output 3. The amplifier arrangement input signal $TX_{in}$ may be, but is not limited to, a radio transmission signal.

The amplifier arrangement 1 of the present disclosure comprises a first transistor cell 4, a second transistor cell 5, a third transistor cell 6, and a fourth transistor cell 7 as part of a power amplifier in an integrated circuit. The person skilled in the art will appreciated that the number of the transistor cells will be chosen according to the envisaged conditions such as output power and heat dissipation. Two transistor cells are the minimum number of the transistor cells for implementing this aspect of the present disclosure, but in another application a dozen or even hundreds of the transistor cells may be the right choice. In the present disclosure the integrated transistor cells are heterojunction bipolar transistors.

A first base finger of the first transistor cell 4 is connected via a first coupling capacitor 8 to the amplifier input 1. A second base finger of the second transistor cell 5 is connected via a second coupling capacitor 9 to the amplifier input 1. A third base finger of the third transistor cell 6 is connected via a third coupling capacitor 10 to the amplifier input 1. Finally a fourth base finger of the fourth transistor cell 7 is connected via a fourth coupling capacitor to the amplifier input 1. A first emitter of the first transistor cell 4 is connected to a reference voltage GND. A second emitter of the second transistor cell 5 is connected to the reference voltage GND. A third emitter of the third transistor cell 7 is connected to the reference voltage GND. Finally a fourth emitter of the fourth transistor cell 8 is connected to the reference voltage GND. A first collector of the first transistor cell 4, a second collector of the second transistor cell 5, a third collector of the third transistor cell 6, and a fourth collector of the fourth transistor cell 7 are interconnected with each other and form the amplifier output 3.

The term "transistor cell" used for the first transistor cell 4, the second transistor cell 5, the third transistor cell 6 and the fourth transistor cell 7 can be interpreted in a very general way. Each of these transistor cells 4, 5, 6 or 7 could be either implemented as a single-base-finger transistor or using one (or more) fingers of a multi-base-finger transistor. In other words, base ballasting can be done on base-finger level as well as on multi-finger-transistor-level.

Figure 1B:
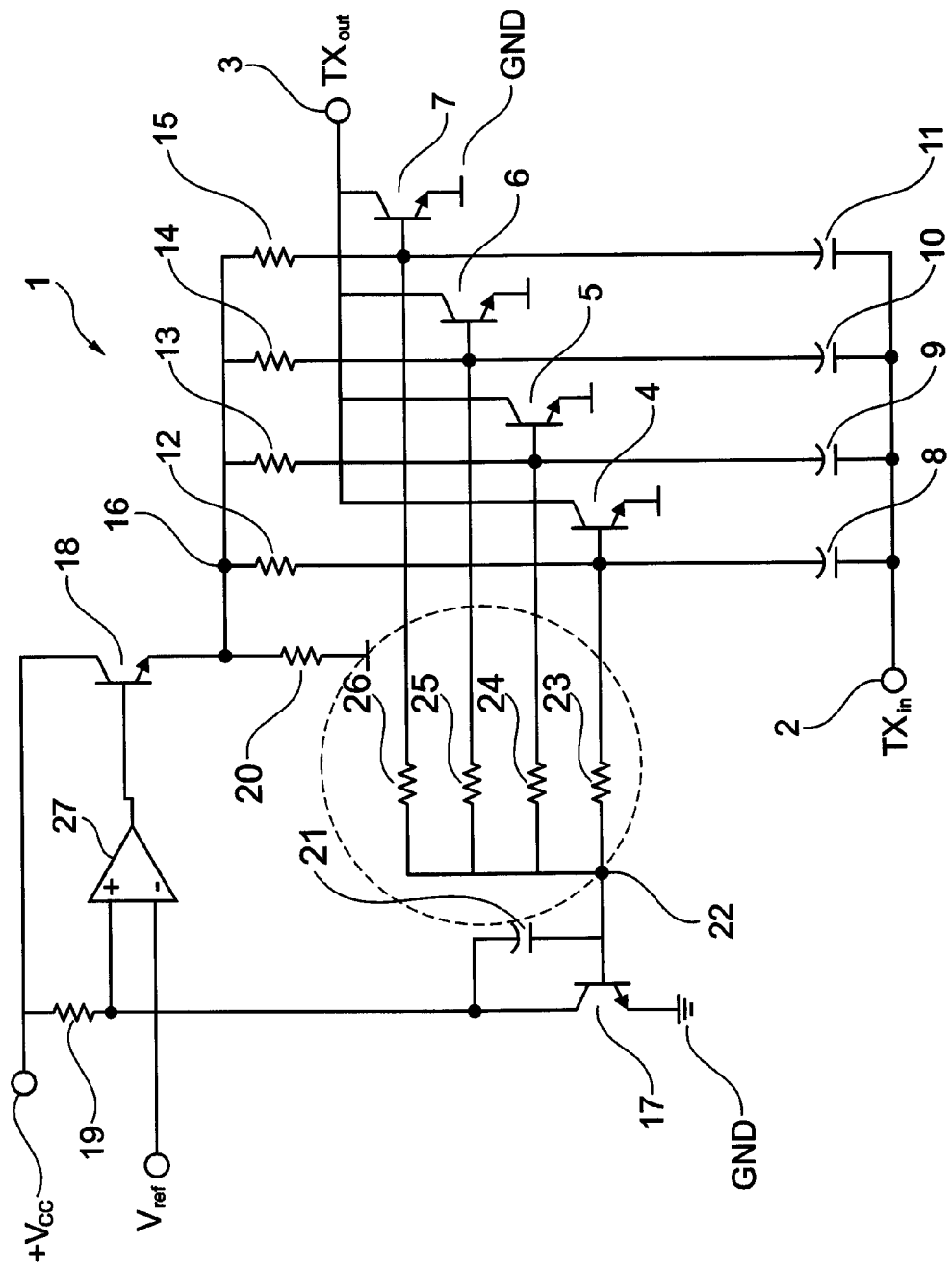
FIG. 1b shows a second aspect of the amplifier arrangement according to the present disclosure
Figure 1C:
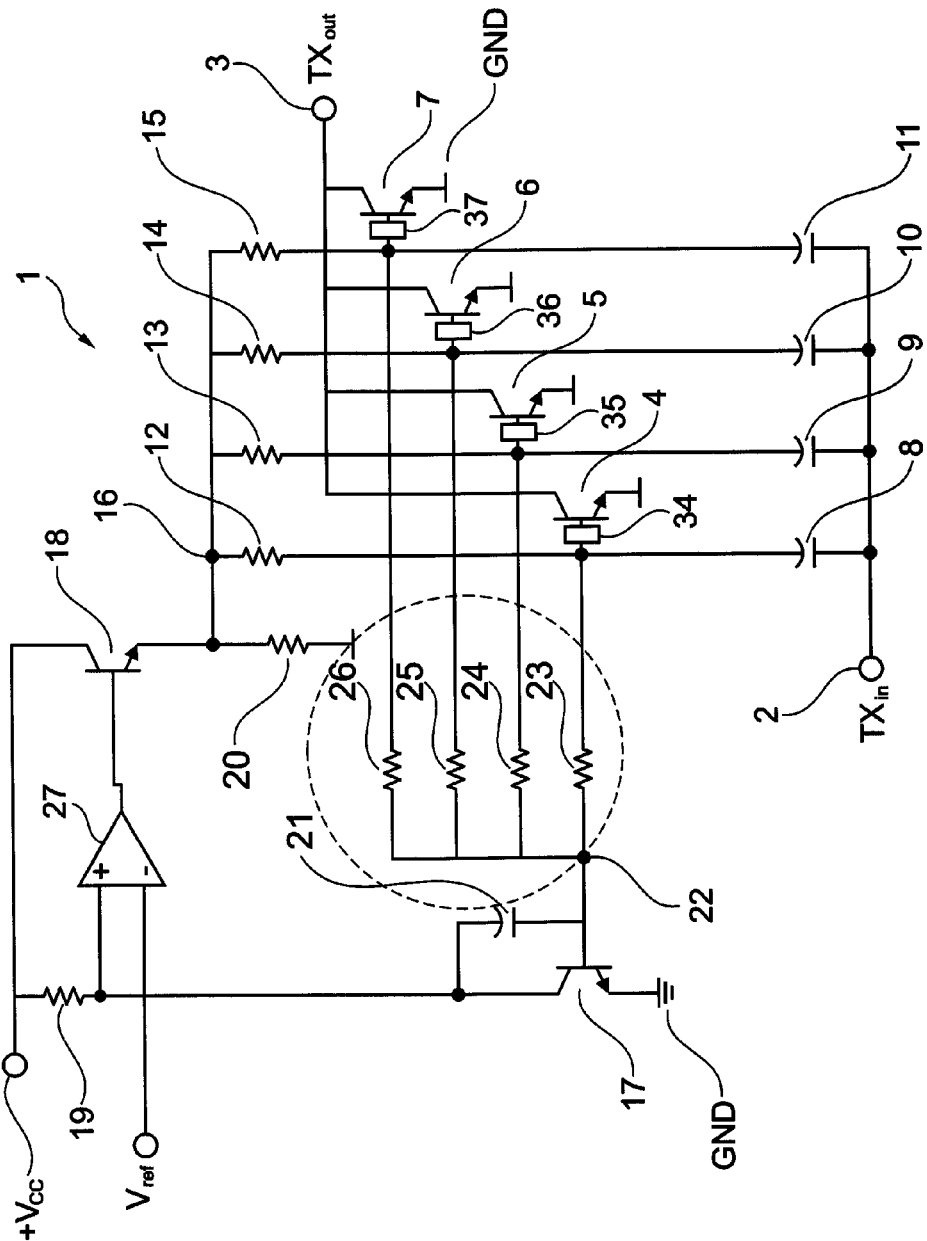

FIG. 1c shows a further aspect of the invention in which an additional first series resistance 34 is connected to the base of the first transistor cell 4, an additional second series resistance 35 is connected to the base of the second transistor cell 5, an additional third series resistance 36 is connected to the base of the third transistor cell 6 and an additional fourth series resistance 37 is connected to the base of the fourth transistor cell 7. It will be appreciated that the additional series resistances 34, 35, 36 or 37 can be placed separately at each one of the base fingers or in common for all of the fingers of a multi base finger transistor. It will be appreciated that the additional series resistances 34, 35, 36 and 37 can be added to the base of any of the transistor cells 4, 5, 6, or 7 used in the amplifier arrangement of this disclosure.

A first ballast resistance 12 connects the first base finger of the first transistor cell 4 with a common base terminal 16. A second ballast resistance 13 connects the second base finger of the second transistor cell 5 with the common base terminal 16. A third ballast resistance 14 connects the third base finger of the third transistor cell 6 with the common base terminal 16. A fourth ballast resistance 15 connects the fourth base finger of the fourth transistor cell 7 with the common base terminal 16. To the common base terminal 16 a bias voltage is applied to set the working point of the four transistor cells (the first transistor cell 4, the second transistor cell 5, the third transistor cell 6, and the fourth transistor cell 7).

In the event that the properties of the four transistor cells 4, 5, 6, 7 and the four ballast resistance (the first ballast resistance 12, the second ballast resistance 13, the third ballast resistance 4, and the fourth ballast resistance 15) are equally dimensioned, substantially equal currents will flow through the collector-emitter path of the four transistor cells, 4, 5, 6, 7 and will draw substantially equal base-emitter currents of the four transistor cells 4, 5, 6, 7. In the real world, the four transistor cells 4, 5, 6 and 7 are likely to be slightly asymmetric and thus at least one of the four transistor cells 4, 5, 6, or 7, is likely to conduct better than the other ones of the four transistor cells 4, 5, 6 or 7. As this better conducting transistor cell will heat up a little bit more than the other ones of the four transistor cells 4, 5, 6 or 7, this better conducting transistor cell is termed in the present disclosure a "thermal runaway transistor cell". The heat up of the thermal runaway transistor cell increases even more the collector current of the thermal runaway transistor cell, as was discussed in the introduction to the description. A self-reinforcing process would start that, in the end, would end up destroy at least the thermal runaway transistor cell and possibly all of the semiconductor devices.

The increased collector-emitter current of the thermal runaway transistor cell also draws more current at its base, thus causing a higher voltage drop across the ballast resistance that is connected to the thermal runaway transistor cell. This lowers the base-emitter voltage at the thermal runaway transistor cell and countervails the self-reinforcing heat up of the thermal runaway transistor cell as long as the ballast resistance is sufficiently dimensioned. However, a sufficiently high-dimensioned ballast resistance causes signal compression, so that the achievable output power of the amplifier arrangement stays far below the output power that may be achieved with an amplifier arrangement without any of the ballast resistances. Furthermore, linearity of the amplifier would be degraded, thus leading to unwanted adjacent channel radiation or to an increased error vector (EVM) distortion of the transmit signal.

The amplifier arrangement 1 comprises a feedback device in order to enable the amplifier arrangement 1 to avoid the early signal compression. The feedback device of the present disclosure comprises a feedback transistor 17, a bias supply transistor 18, a bias setting resistor 19, an optional bias emitter resistor 20, and an optional low pass filter capacitor 21. A base of the feedback transistor 17 forms the feedback device input and is connected with a feedback terminal 22. The feedback terminal 22 is connected through a first feedback resistor 23 to the first base finger of the first transistor 4. The feedback terminal 22 is further connected through a second feedback resistor 24 to the second base finger of the second transistor 6. The feedback terminal 22 is further connected through a third feedback resistor 25 to the third base finger of the third transistor 6. The feedback terminal 22 is finally connected through a fourth feedback resistor 26 to the fourth base finger of the fourth transistor 7.

The person skilled in the art will appreciate that the feedback transistor 21 instead of being connected to all of the four ballast resistances 12, 13, 14, 15 may be connected only to a subset of the four ballast resistances 12, 13, 14, 15, for example only to the second ballast resistance 13 and the third ballast resistance 14 as the middle transistor cells (the second transistor cell 5 and the 6 transistor cell 7) may be more likely to heat up than the transistor cells on the flanks (the first transistor cell 4 and the fourth transistor cell 7).

A fifth emitter of the feedback transistor 17 is connected to the reference level GND and a fifth collector of the feedback transistor 17 is connected through the bias setting resistor 19 to a positive supply voltage $V_{CC}$. A sixth base of the bias transistor 18 is connected to the fifth collector of the feedback transistor 17. A sixth collector of the bias transistor 18 is connected to the positive supply voltage $V_{CC}$ and a sixth emitter of the bias transistor 18 is connected through a emitter resistor 20 to the reference level GND. The sixth emitter of the bias transistor 18 forms the output of the feedback device and is connected to the common base terminal 16.

By providing the four feedback resistors (the first feedback resistor 23, the second feedback resistor 24, the third feedback resistor 25, and the fourth feedback resistor 26) the base voltage of the first transistor cell 4, the second transistor cell 5, the third transistor cell 6, and the fourth transistor cell 7 are kept constant over drive.

FIG. 1b shows a second aspect of the invention in which many of the elements are identical to the elements of FIG. 1a and are thus given identical reference signs. The second aspect of the invention includes additionally an operational amplifier 27 which output is connected to the base of the of the bias supply transistor 18. The operational amplifier 27 has two inputs. A non-inverting input is connected between the bias supply transistor 18 and the feedback transistor 17 and an inverting input is connected to a reference voltage $V_{ref}$. The operational amplifier 27 is used to enable that substantially similar currents flow through the first transistor cell 4, the second transistor cell 5, the third transistor cell 6, the fourth transistor cell 7 and the feedback resistor 17. Each of the transistors from which the first transistor cell 4, the second transistor cell 5, the third transistor cell 6, the fourth transistor cell 7 and the feedback resistor 17 are constructed are substantially identical and are situated near each other on the semiconductor chip. Thus each ones of the transistors from which the first transistor cell 4, the second transistor cell 5, the third transistor cell 6, the fourth transistor cell 7 and the feedback resistor 17 will heat up by a similar amount and thus there will be little change of thermal properties between the various ones of the first transistor cell 4, the second transistor cell 5, the third transistor cell 6, the fourth transistor cell 7 and the feedback resistor 17.

The feedback transistor 17 will in fact carry about 90% of the collector emitter voltage of the transistors in the first transistor cell 4, the second transistor cell 5, the third transistor cell 6, or the fourth transistor cell 7 as part of the voltage (around 10%) also drops across the bias setting resistor 19.

The operational amplifier 27 works as follows. If the base voltage on one or more of the transistors in the first transistor cell 4, the second transistor cell 5, the third transistor cell 6, or the fourth transistor cell 7 is too high, then more current than required flows through the affected one of the first transistor cell 4, the second transistor cell 5, the third transistor cell 6, or the fourth transistor cell 7. This means that the base voltage at the feedback transistor 17 is also higher and thus more collector current will flow through the feedback transistor 17 from the bias setting resistor 19 to earth. This will mean that there is a voltage drop across the bias setting resistor 19 which leads to a change in the voltage at the non-inverting input of the operational amplifier 27. The inverting input of the operational amplifier 27 is connected to a reference voltage $V_{ref}$, as explained above. Thus the change in the voltage at the non-inverting input leads to a change in the output voltage of the operational amplifier 27, which then reduces the current following through the bias supply transistor 18. The bias supply transistor 18 is connected through one of the first ballast resistance 12, the second ballast resistance 13, the third ballast resistance 14 and the fourth ballast resistance 15 to base of the transistors in the first transistor cell 4, the second transistor cell 5, the third transistor cell 6, or the fourth transistor cell 7. Thus the base voltage on the transistors is adjusted to reduce the amount of current flowing through the first transistor cell 4, the second transistor cell 5, the third transistor cell 6, or the fourth transistor cell 7.

Figure 2:
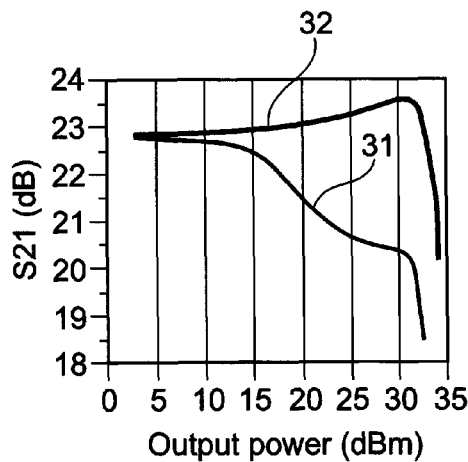

FIG. 2 shows a simulation result that depicts the gain versus the output power of an amplifier arrangement 1 with the ballast resistances 12, 13, 14, 15, as shown in FIG. 1a. The lower line 31 represents an amplifier arrangement according to the prior art without a feedback device. The lower line 31 demonstrates clearly that with increasing output power the gain is decreasing. The upper line 32 demonstrates the effect of the feedback device shown in FIG. 1a that even slightly increases the gain when the output power is increased up to the point at around 31 dBm where the amplifier arrangement 1 according to FIG. 1a starts to go into compression mode.

Figure 3:
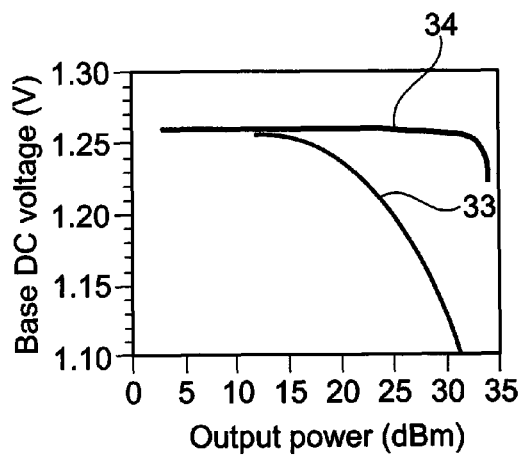
FIG. 3 shows another simulation result for another aspect of the amplifier arrangement according to the present disclosure.

FIG. 3 shows another simulation result with the base voltage at one of the first base finger, the second base finger, the third base finger or the fourth base finger versus the output power. The lower line 33 depicting the relation between the base finger voltage of a prior art amplifier arrangement without feedback device shows the drop of the base finger voltage. The upper line 34 demonstrates how the base finger voltage of the first transistor cell 4, the second transistor cell 5, the third transistor cell 6, and the fourth transistor cell 7 is kept constant at substantially 1.26 Volts over a long range of the output power, before finally around an output power of 31 dBm the base finger voltage cannot further be sustained at that level. Both FIGS. 2 and 3 clearly show that no compromise has to be made between the risks of current hogging caused by weak ballast resistances versus early compression caused by strong ballast resistances.

Figure 4:
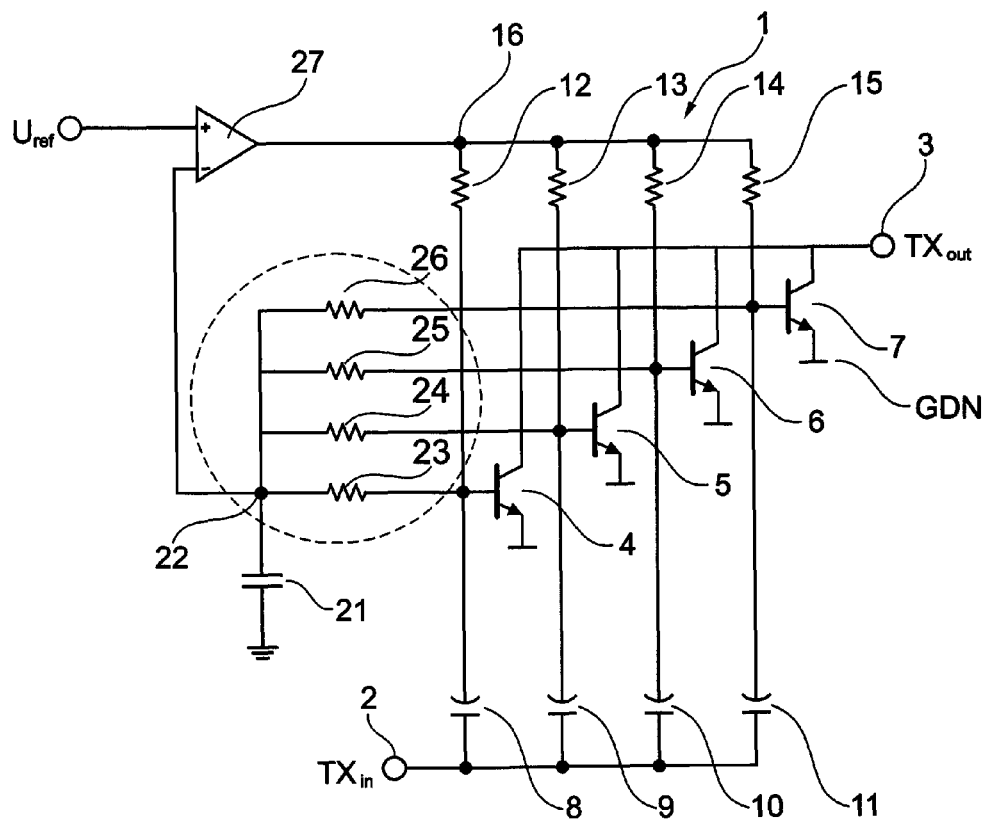
FIG. 4 shows another aspect of the amplifier arrangement according to the present disclosure.

FIG. 4 shows another aspect of the present disclosure with an amplifier arrangement that has a similar structure as in FIG. 1a or 1b. Therefore the same reference numerals have been used to reference the same elements. In this aspect of the present disclosure the feedback device is an integrated operational amplifier 27 that could be integrated on the same semiconductor chip as the amplifier arrangement 1.

The differential amplifier 27 comprises a non-inverting input connected to a reference voltage $V_{ref}$ and an inverting input connected to the feedback terminal 22. An output of the operational amplifier 27 is connected to the base terminal 16. The reference voltage $U_{ref}$ corresponds to the voltage that should be maintained at the base terminal 16. In the event that one of the first transistor cell 4, the second transistor cell 5, the third transistor cell 6, or the fourth transistor cell 7 starts current hogging the voltage drop of the first ballast resistor 12, the second ballast resistor 13, the third ballast resistor 14, or the fourth ballast resistor 15 increases. With the increasing voltage drop the voltage at the feedback terminal 22 relative to reference level GND drops and causes the differential amplifier 27 to increase the voltage at the common base terminal 16.

In the event that the feedback device is integrated on the same semiconductor chip as the first transistor cell 4, the second transistor cell 5, the third transistor cell 6, and the fourth transistor cell 7 the gain of the amplifier arrangement 1 is kept constant also over temperature, process and drive power. As no additional components are required the amplifier arrangement 1 of the present disclosure is cost effective and does not suffer from a lowered mean time between failures due to external components that often bear the risk to introduce lower reliability.

Figure 5:
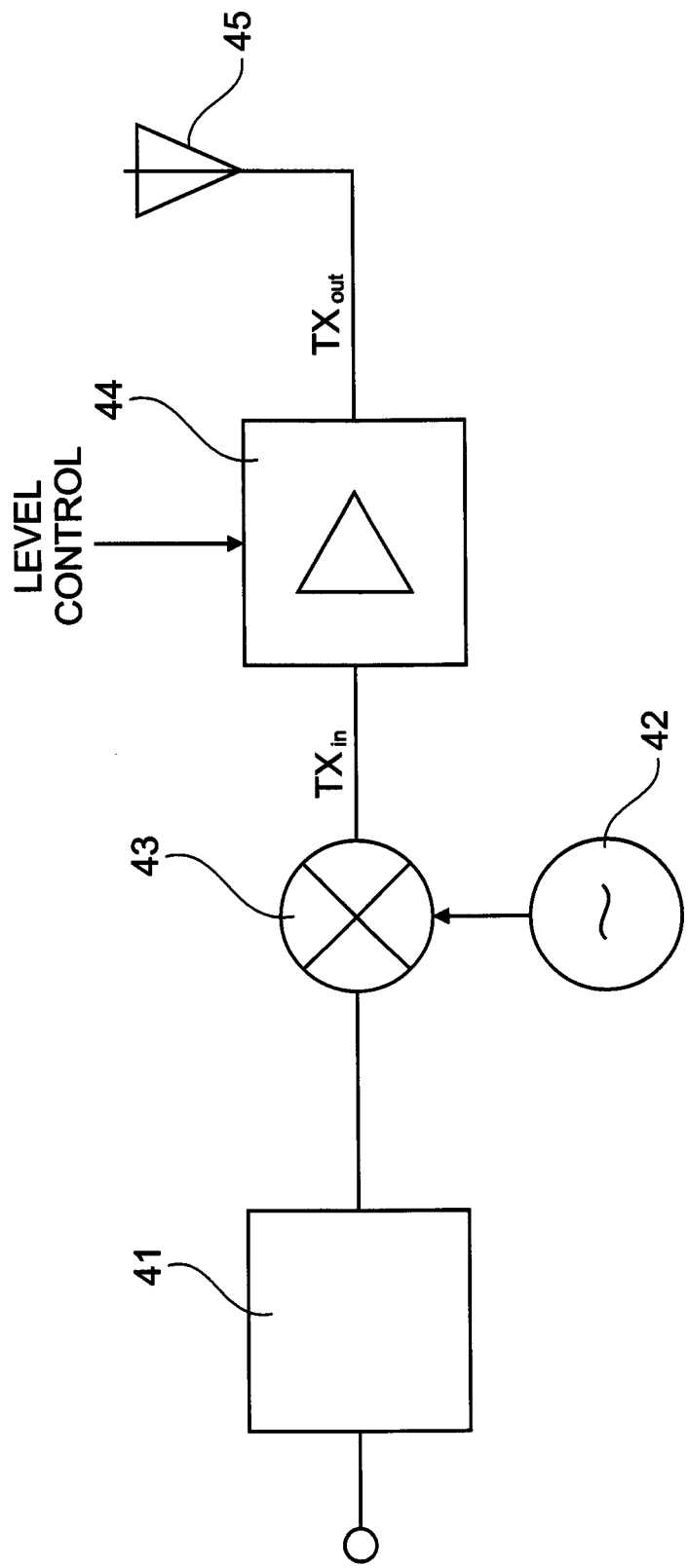
FIG. 5 shows the use of the amplifier arrangement of the disclosure in a radio station.

FIG. 5 shows as another aspect of the present disclosure the use of the amplifier arrangement in a radio station. The radio station may for example be part of an antenna array system for the mobile communications network. As this aspect of the present disclosure relates only to the transmitting part of the radio station, only the transmitting part is shown, although the person skilled in the art will appreciate that the radio station for the mobile communications network will also include circuit arrangements for receiving the radio signal. For reasons of clarity only the most essential components are presented in FIG. 5. In the context of this disclosure the radio station is part of, but is not limited to a base transceiver station, as known from GSM networks, as well as a node B (known from UMTS/3G networks) or enhanced node B, and similar units used in other mobile communication net-work.

A base band signal, which comprises encoded data, e.g. encoded voice data, is modulated in an I/Q-modulator 41. The modulated signal is mixed with a radio frequency signal from a synthesized local oscillator 42 in an up-converter 43 and passed to a power amplifier 44 as a transmit input signal $TX_{in}$. The power amplifier 44 may, in some implementations, be controlled by a control signal LEVEL CONTROL to set a defined power level of the amplified transmit signal $TX_{out}$. The control signal LEVEL CONTROL is required, for example, in a GSM implementation, but not in a UMTS or LTE implementation. The amplified radio signal $TX_{out}$ is passed to an antenna 45. The power amplifier 44 in this aspect of the present disclosure corresponds to the power amplifier described in the present disclosure.

The present disclosure further relates to a computer program product embedded on a computer readable medium. The computer program product comprises executable instructions for the manufacture of the amplifier arrangement of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, a layout description language (GDS, GDS II, Gerber, . . . ), a circuit description language (Spice) and so on, or other available programs. Such software can be disposed in any known computer usable medium such as semiconductor, magnetic disk, or optical disc (e.g., CO-ROM, OVO-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

Reference Numerals
4 First transistor cell
5 Second transistor cell
6 Third transistor cell
7 Fourth transistor cell
8 First coupling capacitor
9 Second coupling capacitor
10 Third coupling capacitor
11 Fourth coupling capacitor
12 First ballast resistance
13 Second ballast resistance
14 Third ballast resistance
15 Fourth ballast resistance
16 Base terminal
17 Feedback transistor
18 Bias supply transistor
19 Bias setting resistor
20 Bias emitter resistor
21 Low pass filter capacitor
22 Feedback terminal
23 First feedback resistor
24 Second feedback resistor
25 Third feedback resistor
26 Fourth feedback resistor
27 Operational amplifier
34 First series resistance
35 Second series resistance
36 Third series resistance
37 Fourth series resistance

The invention claimed is:

1. An amplifier arrangement with an amplifier arrangement input and an amplifier arrangement output, the amplifier arrangement comprising
a first transistor and a first ballast resistance, wherein the first ballast resistance connects a first transistor base of the first transistor to a common base terminal
at least one second transistor and at least one second ballast resistance, wherein the at least one second ballast resistance connects a second transistor base of the at least second transistor to the common base terminal; and
a feedback device comprising a direct current operational amplifier having reference input connected to a reference voltage and a feedback input terminal for sensing at least a base voltage of the first transistor, a first feedback resistance connecting the first transistor base of the first transistor to the feedback device input terminal, at least one second feedback resistance connecting the second base of the at least one second transistor to the feedback device input terminal and the direct current operational amplifier further comprising a feedback output terminal that is connected to the common base terminal.

2. The amplifier arrangement according to claim 1 wherein the first transistor and the least one second transistor are at least one of a heterojunction bipolar transistor or a homojunction bipolar transistor.

3. The amplifier arrangement according to claim 1 wherein the feedback device further comprises a feedback transistor with a feedback transistor base, a feedback transistor emitter and a feedback transistor collector, and wherein the feedback transistor base is the input of the feedback device.

4. The amplifier arrangement according to claim 3 further comprising a bias supply transistor comprising a bias supply transistor base, a bias supply transistor collector and a bias supply transistor emitter, wherein the bias supply transistor emitter is the output of the feedback device.

5. The amplifier arrangement according to claim 4, wherein the feedback transistor emitter is connected to a reference voltage, the feedback transistor collector is connected through a bias setting resistor to a supply voltage, the bias supply transistor base is connected to the feedback transistor collector, the bias supply transistor collector is connected to the supply voltage and the bias supply transistor emitter is connected to the reference voltage.

6. The amplifier arrangement according to claim 3 wherein the feedback transistor collector and the feedback transistor base are connected to each other through a first capacitor.

7. A radio station comprising an amplifier arrangement for amplifying a radio signal comprising a first transistor and a first ballast resistance, wherein the first ballast resistance connects a first transistor base of the first transistor to a common base terminal at least one second transistor and at least one second ballast resistance, wherein the at least one second ballast resistance connects a second transistor base of the at least second transistor to the common base terminal; and a feedback device comprising a direct current operational amplifier having a reference input connected to a reference voltage and a feedback input terminal for sensing at least a base voltage of the first transistor, a first feedback resistance connecting the first transistor base of the first transistor to the feedback device input terminal, at least one second feedback resistance connecting the second base of the at least one second transistor to the feedback device input terminal, and the direct current operational amplifier further comprising a feedback output terminal that is connected to the common base terminal.

* * * * *